US012796101B2

(12) United States Patent
Delacruz et al.

(10) Patent No.: US 12,796,101 B2

(45) Date of Patent: Nov. 10, 2026

(54) BACK BIASING OF FD-SOI CIRCUIT BLOCK

(71) Applicant: ADEIA SEMICONDUCTOR INC., San Jose, CA (US)

(72) Inventors: Javier A. Delacruz, San Jose, CA (US); David Edward Fisch, Pleasanton, CA (US); Kenneth Duong, San Jose, CA (US); Xu Chang, San Jose, CA (US); Liang Wang, Milpitas, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 192 days.

(21) Appl. No.: 17/410,600

(22) Filed: Aug. 24, 2021

(65) Prior Publication Data

US 2022/0020741 A1 Jan. 20, 2022

Related U.S. Application Data

(63) Continuation of application No. 15/892,734, filed on Feb. 9, 2018.

(51) Int. Cl.
*H10D 88/00* (2026.01)
*G11C 5/14* (2006.01)
(Continued)

(52) U.S. Cl.
CPC ............ *H10D 88/00* (2025.01); *G11C 5/147* (2013.01); *H03K 17/687* (2013.01);
(Continued)

(58) Field of Classification Search
CPC ......... H01L 27/0688; H01L 21/823475; H01L 21/84; H01L 24/08; H01L 25/065;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013-033786 A 2/2013
JP 2018-160519 10/2018
WO WO 2005/043584 A2 5/2005

OTHER PUBLICATIONS

N.G., Tarr et al., "A simple implanted backgate MOSFET for dynamic threshold control in fully-depleted SOI CMOS," Proceedings1996 IEEE International SOI Conference, Oct. 1996, pp. 76-77.
(Continued)

*Primary Examiner* — Benjamin Tzu-Hung Liu

(74) *Attorney, Agent, or Firm* — Knobbe, Martens, Olson & Bear, LLP

(57) ABSTRACT

A microelectronic circuit structure comprises a stack of bonded layers comprising a bottom layer and at least one upper layer. At least one of the upper layers comprises an oxide layer having a back surface and a front surface closer to the bottom layer than the back surface, and a plurality of FD-SOI transistors built on the from surface. At least a first back gate line and a second back gate line extend separate from each other above the back surface for independently providing a first back gate bias to a first group of transistors and a second back gate bias to a second different group of transistors.

21 Claims, 4 Drawing Sheets

(51) Int. Cl.

| | |
|---|---|
| ***H03K 17/687*** | (2006.01) |
| ***H10D 84/01*** | (2026.01) |
| ***H10D 84/03*** | (2025.01) |
| ***H10D 84/83*** | (2025.01) |
| ***H10D 86/00*** | (2025.01) |
| ***H10D 86/01*** | (2026.01) |
| ***H10W 72/00*** | (2026.01) |
| ***H10W 72/30*** | (2026.01) |
| ***H10W 72/90*** | (2026.01) |
| ***H10W 80/00*** | (2026.01) |
| ***H10W 90/00*** | (2026.01) |

(52) U.S. Cl.
CPC ....... *H10D 84/0149* (2025.01); *H10D 84/038* (2025.01); *H10D 84/83* (2025.01); *H10D 86/01* (2025.01); *H10D 86/201* (2025.01); *H10W 90/00* (2026.01); *H10W 72/07331* (2026.01); *H10W 72/353* (2026.01); *H10W 72/952* (2026.01); *H10W 80/312* (2026.01); *H10W 90/732* (2026.01); *H10W 90/792* (2026.01)

(58) Field of Classification Search
CPC ... H01L 27/088; H01L 27/1203; H01L 24/05; H01L 24/29; H01L 24/80; H01L 24/83; H01L 2224/056; H01L 2224/08146; H01L 2224/08148; H01L 2224/29186; H01L 2224/32145; H01L 2224/80895; H01L 2224/83896; H01L 2924/14; H03K 17/687; G11C 5/147; H10D 88/00; H10D 84/0149; H10D 84/038; H10D 84/83; H10D 86/01; H10D 86/201; H10W 90/00; H10W 72/07331; H10W 72/353; H10W 72/952; H10W 80/312; H10W 90/732; H10W 90/792
See application file for complete search history.

(56) References Cited

U.S. PATENT DOCUMENTS 6,080,640 A 6/2000 Gardner et al.
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,508,289 B2 * 8/2013 Mazure .................. H10D 89/10 257/365
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,816,754 B1 8/2014 Clark et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,378,967 B1 * 8/2019 Vogelsang .......... H01L 27/1203
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.

(56) References Cited

U.S. PATENT DOCUMENTS 11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,476,213 B2 10/2022 Haba et al.
11,515,291 B2 11/2022 DeLaCruz et al.
2004/0084414 A1 5/2004 Sakai et al.
2005/0204319 A1* 9/2005 Hanafi ............... H03K 19/0013 716/136
2006/0057945 A1 3/2006 Hsu et al.
2007/0111386 A1 5/2007 Kim et al.
2007/0187769 A1* 8/2007 Anderson .............. H10B 10/00 257/E27.098
2008/0135924 A1* 6/2008 Lebby ................ H10D 30/6744 257/E21.409
2012/0299105 A1* 11/2012 Cai ...................... H10D 86/201 257/E21.632
2014/0103533 A1* 4/2014 Bedell ............... H01L 29/78603 257/773
2014/0175655 A1 6/2014 Chen et al.
2014/0292374 A1 10/2014 Giraud et al.
2015/0064498 A1 3/2015 Tong
2015/0333056 A1* 11/2015 Du ....................... H10D 84/038 257/773
2016/0117584 A1 4/2016 Yoneda et al.
2016/0343682 A1 11/2016 Kawasaki
2017/0330876 A1* 11/2017 Leedy ................ G02B 6/12002
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2019/0004895 A1 1/2019 Lee
2019/0115277 A1 4/2019 Yu et al.
2019/0131277 A1 5/2019 Yang et al.
2019/0181264 A1* 6/2019 Cheng .................. H10D 30/023
2019/0363129 A1* 11/2019 Yokoyama ............ H01L 29/786
2019/0385935 A1 12/2019 Gao et al.
2020/0013765 A1 1/2020 Fountain, Jr. et al.
2020/0035641 A1 1/2020 Fountain, Jr. et al.
2020/0294908 A1 9/2020 Haba et al.
2020/0328162 A1 10/2020 Haba et al.
2020/0395321 A1 12/2020 Katkar et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0299029 A1 9/2023 Theil et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh

OTHER PUBLICATIONS

Xu et al., "Compact Capacitance and Capacitive Coupling-Noise Modeling of Through-Oxide Vias in FDSOI Based Ultra-High Density 3-D ICs" 978-1-4577-0505-2/11/ IEEE, (2011) pp. 34.8.1-34.8.4.

Gaynor, Brad D. et al., "Parasitic Back-Gate Effect in 3-D Fully Depleted Silicon on Insulator Integrated Circuits", IEEE Transactions on Components, Packaging and Manufacturing Technology, (2013). pp. 1-9.

Tech Design Forum, FD-SOI Guide, [online] [retrieved May 8, 2018]. Retrieved from the Internet: <URL:http://www.techdesignforums.com/practice/guides/fd-soi/>, (undated) 2 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H et al., "Overview of recent direct wafer bonding advances and applications," Advances in Natural Sciences—Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

(56) References Cited

OTHER PUBLICATIONS

Bush, Steve, "Electronica: Automotive power modules from On Semi," ElectronicsWeekly.com, indicating an OnSemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

OnSemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "OnSemi AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

* cited by examiner

1

BACK BIASING OF FD-SOI CIRCUIT BLOCK

FIELD

The present invention relates to a 3D microelectronic circuit structure including a plurality of die stacked on one another and wherein an upper die in the stack comprises back biased Fully depleted silicon-on-insulator (FD-SOI) circuit blocks.

BACKGROUND

FD-SOI, also known as ultra-thin or extremely thin silicon-on-insulator (ET-SOI), is an alternative to bulk silicon as a substrate for building transistors, such as CMOS devices. The construction process of a wafer with FD-SOI transistors starts with growing a thin layer of oxide, called the buried oxide (BOX), on a bulk silicon wafer; the layer of oxide acts as an insulator. A very thin (shallow) layer of epitaxial silicon is then grown on top of the oxide laser for implementing a channel for transistors; this top silicon layer is fully depleted, i.e. it does not have any intrinsic charge carrier. The process then continues by realizing the gate, source and drain of the transistors on the obtained FD-SOI substrate, as well as the required inter-connections between transistors.

As such, a transistor built on a FD-SOI substrate has a very thin (shallow) channel, which improves the ability of the gate to remove carriers from that channel when the device needs to be switched-off. Furthermore, the drain-induced barrier lowering (DIBL) that makes it more difficult to turn devices fully off is greatly reduced by the presence of the insulating oxide layer directly beneath the channel.

Thus, FD-SOI offers better performance than conventional bulk silicon in deep submicron process technologies, with particular benefits for low-power circuits. As such, FD-SOI is a leading technology for low-power/low-leakage circuits. For example, according to the SOI Industry Consortium, benchmarks show that using FD-SOI makes it possible to reduce the operating voltage in SRAM cells by 100-150 mV. As such, the operating-voltage reduction afforded by FD-SOI could enable a 40% reduction in memory-array power consumption.

Another advantage of FD-SOI over technologies such as finFET, as well as planar transistors, resides in the possibility to back bias the channels of the transistors in order to provide greater control over the charge carriers flowing through the channels. As such, a bias voltage applied at the back side of the SOI substrate can be used for controlling the threshold voltage of the transistors built on the front side of the SOI substrate.

Referring for example to the article available at http://www.techdesignforums.com/practice/guides/fd-soi/, it is known that dynamically adjusting bias-levels of the transistors allows a circuit to be faster when required, and more energy efficient when performance is not as critical. Thus, increasing the threshold voltage results in a leakage reduction but with transistors become slower. On the other hand, decreasing the threshold voltage results in faster transistors, although with increasing leakage.

Separately, it is further known to dynamically adjust bias-levels in response to process variations and changes in temperature as disclosed in "A simple implanted backgate MOSFET for dynamic threshold control in fully-depleted SOI CMOS" by N. G. Tarr et al.

Referring for example to "Compact capacitance and capacitive coupling-noise modelling of Through-Oxide Vias in FDSOI based ultra-high density 3-D ICs" by Xu et al, it is known that die containing FD-SOI integrated circuits (ICs) can be stacked in order to realise a 3D circuit structure, where the devices of the stacked die can be interconnected through TOVs (Through-Oxide Vias).

Separately, it is known from "Parasitic Back-Gate Effect in 3-D Fully Depleted Silicon on Insulator Integrated Circuits", by Brad D et al, to provide back biasing to the transistors within upper layers of a 3D FD-SOI stacked structure.

SUMMARY

According to a first aspect of the present invention there is provided a microelectronic circuit structure according to claim 1.

According to a second aspect and a third aspect there are provided microelectronic circuits according to claims 14 and 15, respectively.

Embodiments of the invention provides a selective back biasing to different regions of transistors within any given upper FD-SOI layer of a 3D circuit stacked structure.

Selectively providing different bias to different groups of transistors within a stacked microelectronic circuit structure allows parts of a system to operate at higher performance levels without simultaneously causing an entire system to be leakier.

These different regions can correspond to different functional circuit blocks within the given layer, having different optimal performances. In this case selective back biasing is advantageously used to independently provide different back bias signals to the different circuit blocks, as required to reach optimal performances thereof, in this way, an optimal operation for different functional circuit blocks can be achieved, rather than selecting a bias level optimal for one circuital block and indiscriminately imposing it to all the other circuital blocks.

In another case, one region can be affected by parameter variations introduced in the foundry process differently than other regions within the given layer. In this case, upon identification of this region based on measurements, independent back gate lines can be devised accordingly for the given layer. Selective back biasing can then be advantageously applied for compensating the effects of the process variations, by tuning the bias level for the identified region independently to the bias level applied to the other regions. In this way, process variation effects can be controlled at a circuital block-level, instead of predisposing wafer lots that may still have variations built in.

BRIEF DESCRIPTION OF THE DRAWINGS

Embodiments of the invention will now be described, by way of example, with reference to the accompanying drawings, in which.

DESCRIPTION OF THE EMBODIMENTS

Figure 1:
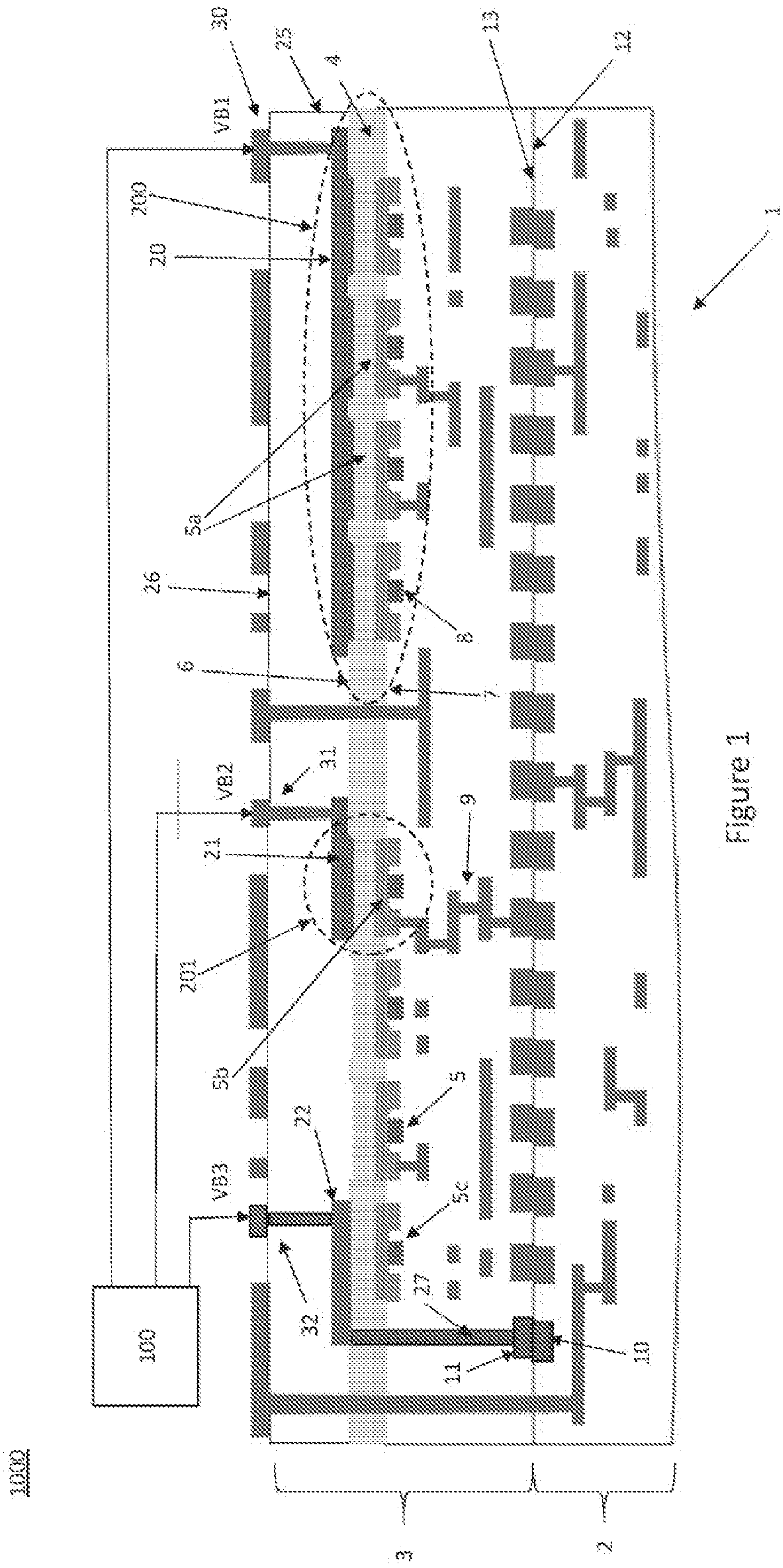
FIG. 1 illustrated a microelectronic circuit comprising a two-layers 3D circuital structure according to a first embodiment of the present invention.

Referring to FIG. 1 there is shown schematically a microelectronic circuit 1000 comprising a stack 1 of two bonded layers, namely a bottom layer 2 and an upper layer 3 stacked onto the bottom layer 2.

Layers 2 and 3 are bonded through direct bonding interconnect (DBI®), which is a low temperature hybrid direct bonding technology developed by the Applicant and which allows lasers comprising either wafers or die to be bonded with exceptionally fine pitch electrical interconnections, without any pressure or adhesives.

As illustrated in FIG. 1, DBI involves a plurality of bond pads 10, 11 disposed at bonding surfaces 12, 13 of the layers 2, 3; during the bending process, the pads 10, 11 expand into one another to form a homogeneous metallic interconnect. In this way, interconnections can occur at the bonding surface 12, 13, thus minimizing the need for TSVs (Through Silicon Vias) or similar interconnections.

Layer 2 preferably comprises a SOI IC; but alternatively, layer 2 can comprise a bulk IC or any other type of semiconductor IC.

Layer 3 comprises a FD-SOI IC; in particular, layer 3 comprises a thin oxide layer 4 used for building the FD-SOI transistors 5. The oxide layer 4 has a back surface 6 and a front surface 7 which is closer to the bottom layer 2 than the back surface the FD-SOI transistors 5 are built on the front surface 7 of the oxide layer 4 in such a way to present front gates 8 facing the bottom layer 2.

As illustrated in FIG. 1, layer 3 comprises various connections frontally provided to the transistors 5, among which connections 9 connect transistors 5 to respective DBI pads 11. In this way, the transistors 5 can be connected when required to circuit parts within the bottom layer 2.

Referring now to the back portion of layer 3, FIG. 1 illustrates three back gate lines 20, 21, 22 of conductive material separated from each other and extending on the back surface 6 of the oxide layer 4. (Note that the silicon substrate used for growing the SOI substrate of the transistors 5 has been removed, e.g. by etching, during the production of the layer 3; in this way, the rear surface 6 of the oxide layer 4 becomes exposed for depositing thereon lines 20, 21, 22.)

In particular, as illustrated in FIG. 1, lines 20, 21, 22 extend separately on the back surface 6 of the oxide layer 4 and are disposed above corresponding different groups of underlying transistors 5*a*, 5*b*, 5*c* which are separated from the lines 20, 21, 22 by the oxide layer 4. In particular, the sectional view of FIG. 1 illustrates four transistors 5*a* of the transistor group below the corresponding line 20, one transistor 5*b* of the transistor group below the corresponding line 21, and one transistor 5*c* of the transistor group below the corresponding line 22. A passivation layer 25 covers the back surface 6 of the oxide layer 4 and the lines 20, 21, 22.

FIG. 1 further illustrates schematically power supply circuitry 100 for selectively supplying back gate bias signals VB1, VB2 and VB3 to the back gate lines 20, 21 and 22, respectively, through separated upper interconnections 30, 31, 32. The upper interconnections 30, 31, 32 pass through the passivation layer 25 and are available for connection at an upper surface 26 of the passivation layer 25; for example, as illustrated in FIG. 1, the interconnections 30, 31, 32 can comprise contacts extending along the surface 26. In this way, lines 20, 21, 22 can be used to separately provide the back gate bias signals VB1, VB2 and VB3 to the corresponding groups of transistors 5*a*, 5*b* and 5*c*; as such, the lines 20, 21, 22 act as back gates for controlling the channels of the corresponding groups of transistors 5*a*, 5*b*, 5*c*.

FIG. 1 further illustrates how the line 22 is connected, through a via 27, to a respective pad 11 at the bonding interface between the layers 2, 3. In this way, the bias signal VB3 can be provided when required to one or more circuit parts of the bottom layer 2; or alternatively the bias signal VB3 can be provided from circuitry such as circuitry 100 through the bottom layer 2.

Figure 2:
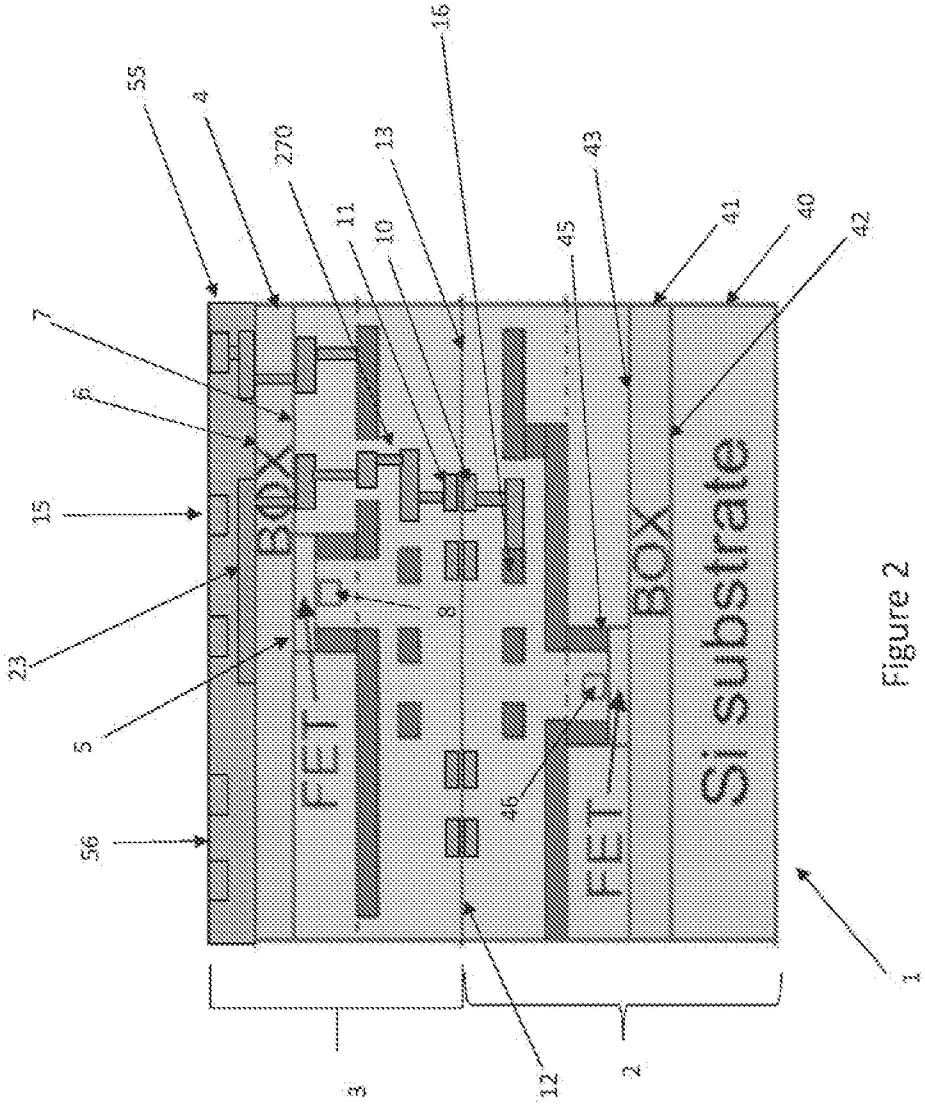
FIG. 2 illustrates a sectional view of a portion of two layers within a 3D circuital structure according to a second embodiment of the present invention.

With reference now to FIG. 2, there is illustrated a portion of two layers 2, 3 of a stack 1 according to another embodiment. The surfaces 12, 13 of layers 2, 3 are bonded to each other through DBI as above disclosed for the layers 2, 3 illustrated in FIG. 1.

The bottom layer 2 of the stack 1 comprises a FD-SOI IC. In particular, the bottom 2 comprises a lower silicon substrate 40, and a thin oxide layer 41 used for building the FD-SOI transistors 45. The oxide layer 41 has a back surface 42 laying on the silicon substrate 40 and a front surface 43 which is closer to the upper layer 3 than the back surface 42. The FD-SOI transistors 45 are built on the front surface 42 of the oxide layer 40 in such a way to present front gates 46 facing the upper layer 3. This lower layer 2 partially illustrated in FIG. 2 also provides an example of how the lower layer 2 of the stack 1 illustrated in FIG. 1 can be realized.

Figure 3:
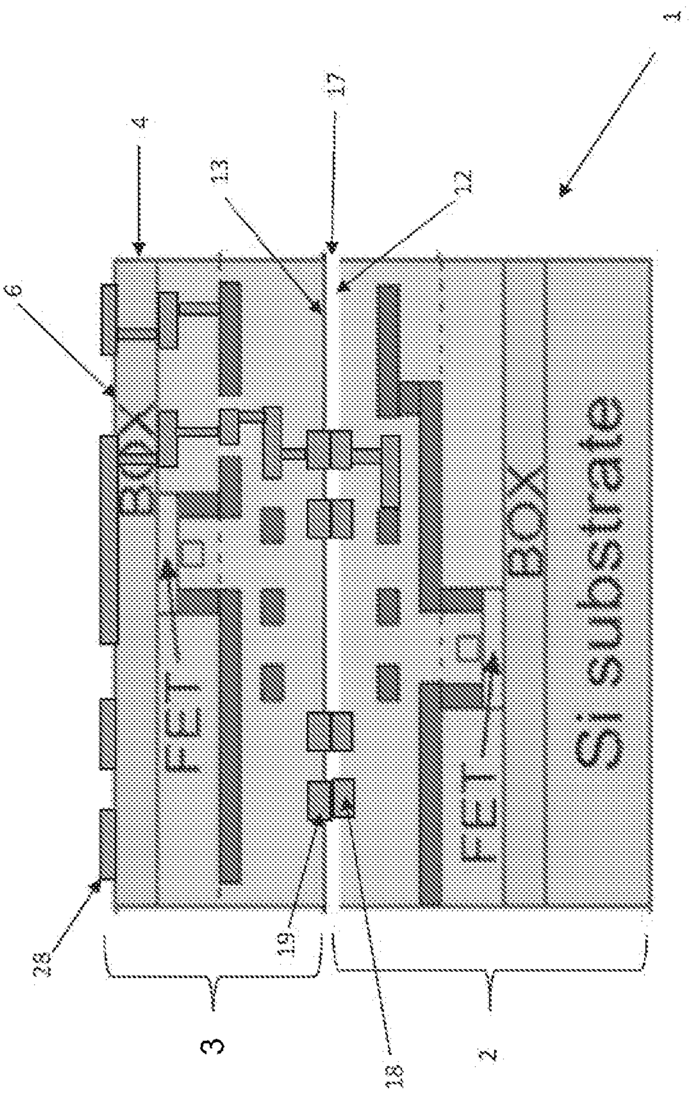
FIG. 3 illustrates a sectional view of a portion of two layers within a 3D circuital structure according to a third embodiment of the present invention.

Although partially illustrated, the upper layer 3 in FIG. 2 has a structure similar to the structure of the upper layer 3 illustrated in FIG. 1. In particular, only one transistor 5 is illustrated in FIG. 3, having its frontal gate 8 facing to the bottom layer 2. As such, the layers 2, 3 are bonded in such a way that their transistors 45 and 5 are disposed face-to-face.

Referring now to the back portion of the upper layer 3, a back gate line 23 of conductive material extends on the back surface 6 of the oxide layer 4, so as to be placed above and act as back gate for a corresponding group of transistors 5 (only one of which viewable in the sectional view of FIG. 2). Although not viewable in the partial illustration of FIG. 2, one or more other back gate lines can extend on the back surface 6 of the oxide layer 4 separated from the line 23, so as to cover corresponding different groups of transistors similarly to the embodiment illustrated in FIG. 1. Interconnections 270 connect the back gate line 23 to a corresponding DBI pad 11 which in turn is connected, through the coupled DBI pad 10, to a contact 16 provided within the bottom layer 2.

The embodiment illustrated in FIG. 2 differs from the embodiment of FIG. 1 in the realization of the upper connections for the layer 3. In particular, a further layer of oxide 55 covers the back surface 6 of the oxide layer 4 and the back gate line 23. Pads 15 for DBI bonding are exposed at an upper surface 56 of the layer 55. At least one of the DBI pads 15 is connected to the line 23 to provide thereto a corresponding back gate bias signal for the underlying transistors 5. In this way, layer 3 is arranged to be DBI bonded to a further upper layer (not shown) for realizing a 3D structure comprising three or more layers.

Such a further upper layer can comprise another FD-SOI IC provided with separate back gate lines for corresponding underlying different groups of transistors. In this case, at least some of the back gate lines associated with the layer 3 can be unconnected to the back gate lines associated with the upper layer, so that the back gate lines associated with the layer 3 and the back gate lines associated with the upper layer can independently provide back biasing signals to the corresponding underlying groups of transistors.

Especially in case that the layer 3 and the upper layer comprise groups of transistors belonging to same or similar functional circuit blocks, the corresponding back gate lines associated with the layer 3 and back gate lines associated with the upper layer can be connected to each other, e.g. through interconnections at the DBI interface between the layers. In this way, back gate lines at the different layers can provide same back gate bias signals to circuit blocks within the layer 3 and the upper layer having the same or similar functionality or performance.

Referring now to FIG. 3 there is illustrated a portion of two layers 2, 3 of a stack 1 according to another embodiment of the presented invention. The embodiment illustrated in FIG. 3 differs to the embodiment illustrated in FIG. 2 in the way in which layer 3 is bonded to the bottom layer 2 and is arranged to be bonded to a further upper layer (not shown). In particular, a non-hybrid bonding solution is used instead of DBI. This solution involves metal-to-metal bonding between pads 18 and 19 at the bonding surfaces 12, 13 of the layers 2 and 3, leaving a small gap 17 between these surfaces 12, 13.

In order to apply a similar metal-to-metal bonding between the layer 2 and the upper layer, metal pads 28 are also disposed at the back surface 6 of the metal oxide 4, together with line 23.

Referring back to FIG. 1, exemplary applications of selective back bias on the transistors 5 of the layer 2 are disclosed.

In one application, the group of transistors 5*a* below the back gate line 20 and the group of transistors 5*b* below the back gate line 21 belong to two different functional circuit blocks 200, 201; for example, the blocks 200, 201 can be different memories of various types, logic circuit blocks, digital circuit blocks, analogue circuit blocks, processors, etc.

It is to be understood that although FIG. 1 schematically illustrates only one transistor 5*b* underlying the back gate line 21 and belonging to circuit 201, circuit 201 can comprise more adjacent rows of transistors 5 and line 21 can extend accordingly on the back surface 6 of the oxide layer 4 to cover also these adjacent rows.

For example, circuit block 200 can be a processor 200 and circuit block 201 can be a memory 201, wherein the processor 200 and memory 201 have different optimal performance points which depend on various parameters, among which the threshold voltage which influences the leakage and switching frequency of the transistors.

As such, the processor 200 can perform at best at a given back bias level for its transistors 5*a*, and the memory 201 can perform best at a given different bias level for its transistors 5*b*.

Accordingly, as illustrated in FIG. 1, different back gate bias signals VB1 and VB2 can be supplied by the power supply circuitry 100 to the respective back gate lines 20 and 21 for being selectively provided to the transistors 5*a* of the processor 200 and the transistors 5*b* of the memory 201.

Furthermore, independently providing signals VB1 and VB2 through the separate back gate lines 20, 21 not only allows signals VB1, VB2 to be provided with different voltage values, but also allows VB1, VB2 to independently vary dynamically over time. In the specific example, the back bias signal VB1 can be advantageously varied according to different states of the processor 200.

In particular, the processor 200 can be in an idle standby state, where no activity is required, and wake up to an operating state when required. In the standby state leakage is a critical aspect for the performance of processor 200, while processing speed becomes a more relevant aspect when the processor 200 switches to an operational state. Accordingly, the power supply circuitry 100 can supply the back gate bias signal VB1 having a fist value for minimizing the leakage in the transistors 5*a* when the processor 200 is in the idle state, and to change from this low-leakage bias value to a second different value when the processor 200 switches to an operating state. In particular, the second value of the back gate bias signal can be adjusted by the circuitry 100 according to the processing speed and power consumption required to the processor 200 by a fluctuating computational workload.

On the other hand, the memory 201 may require a minimum bias level for its transistors 5*b* in order to stably retain the states in the memory cells realized by the transistors 5*b*. As such, the use of selective back biasing between the processor 200 and the memory 201 is particularly advantageous, because indiscriminately applying a low-leakage bias value to the processor 200 in the idle state and the memory 201 could result in the memory 201 being unable to retain its bit states.

In another example, the circuit block 200 and the circuit block 201 can comprise a cache memory 200 and normal SRAM or DRAM memory 201, respectively, wherein the cache memory 200 requires a faster/higher power consumption operational mode than the normal memory 201. As such, the cache memory 200 can optimally perform at a back bias level which increases the switching frequency of its transistors 5*a;* while the normal memory 201 can optimally perform at a different back bias level which in contrast decreases the switching frequency of its transistors 5*b*. Accordingly, different back gate bias signals VB1 and VB2 can be supplied by the power supply circuitry 100 to the respective back gate lines 20 and 21 for being separately applied to the transistors 5*a* of the cache memory 200 and the transistors 5*b* of the normal memory 201.

Figure 4:
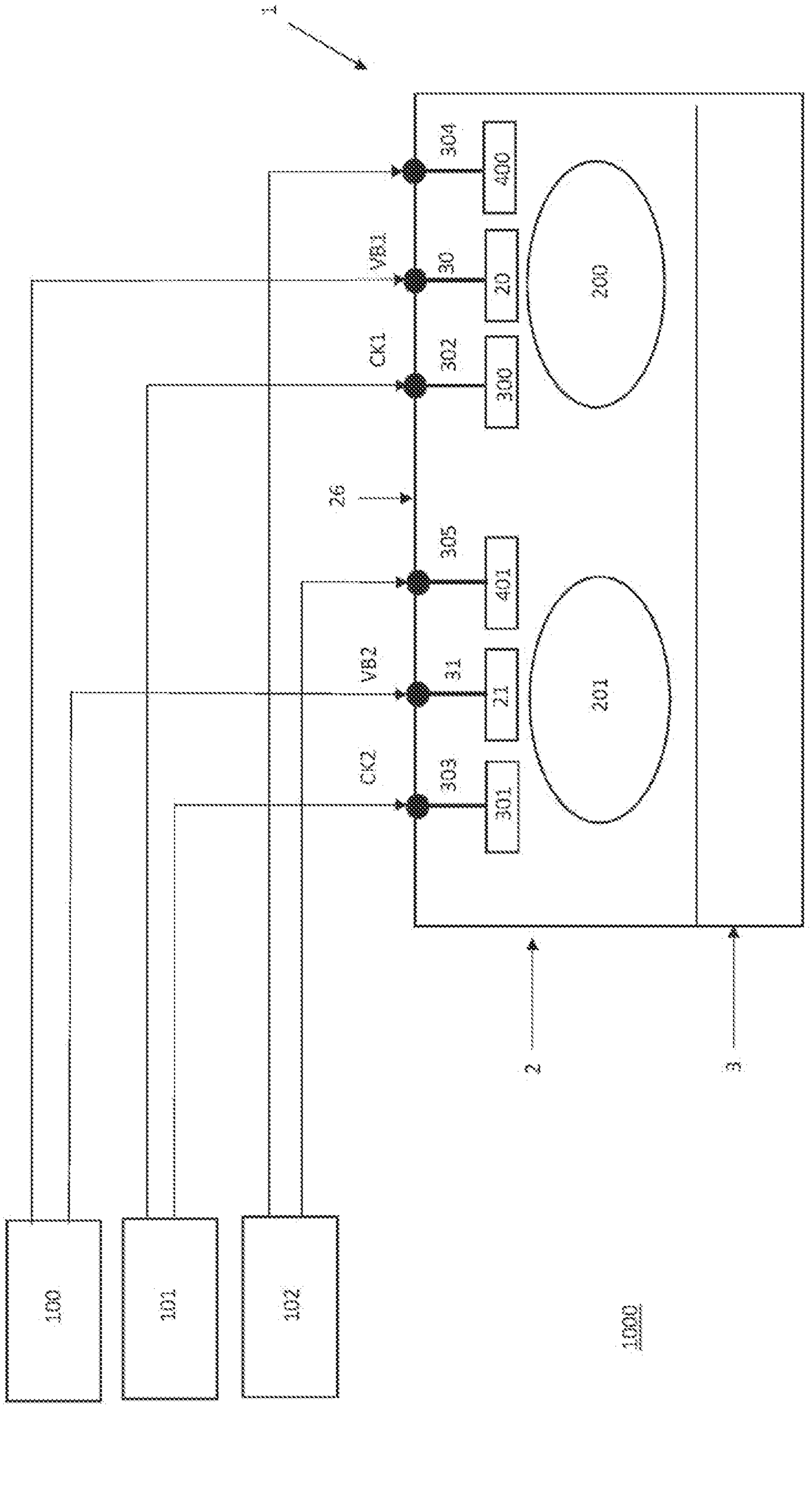
FIG. 4 schematically illustrates a microelectronic circuit according to an embodiment of the present invention.

Reference is now made to FIG. 4, where there is shown schematically how several lines and respective interconnections are associated with the cache and normal memories 200, 201, in addition to the back gate lines 20, 21 and respective interconnections 30, 31.

In particular, the illustrated stacked structure 1 comprises a first clock line 300 and a separated second clock line 301 for independently providing a higher-frequency clock signal CK1 and a lower-frequency clock signal CK2 to the cache memory 200 and the normal memory 201 within the upper layer 3. In addition to the power supply circuitry 100, the circuit 1000 illustrated in FIG. 4 comprises clock generating circuitry 101 configured to independently supply the clock signals CK1 and CK2 to the clock lines 300 and 301, respectively. For example, as schematically illustrated in FIG. 4, the clock lines 300 and 301 can be within the layer 3 and accessible by the clock generating circuitry 101 through respective interconnections 302 and 303 accessible at the upper surface 26 of the layer 3.

Furthermore, the illustrated stacked structure 1 comprises a plurality of faster data lines 400 and slower data lines 401 (cumulatively represented by single lines in FIG. 4) for writing/reading data into/from the cache memory 200 and the normal memory 201, respectively. The circuit 1000 illustrated in FIG. 4 further comprises memory control circuitry 102 connected to the faster data lines 400 and the slower data lines 401 through separated interconnections 304 and 305 and configured to selectively control the data lines 400, 401 to write/read data into/from the cache and normal memories 200, 201. For example, as schematically illustrated in FIG. 4, the data lines 400 and 401 can be within the layer 3 and accessible by the memory control circuitry 102 through respective interconnections 304 and 305 accessible at the upper surface 26 of the layer 3.

Again, referring back to FIG. 1, another application of selective back biasing assumes that the performance of the group of transistors 5*c* within layer 3 is significantly affected by variations of nominal transistor parameters due to the foundry process, while the other transistors 5*a*, 5*b* within the layer 3 are not or differently effected by process variations. One of the factors causing process variations is how rich the N and/or P dopants are in the silicon, there are also variations in the frontal gate 8 length or width, the width being more critical than the length. Due to process variations, the transistors 5*c* can run slower or faster than specified and at lower or higher temperatures aid voltages.

In this scenario, the power supply circuitry 100 cart supply a back gate bias signal VB3 to the back gate line 22, having a voltage value calculated so as to compensate the undesired effects on the transistors 5*c* introduces by the processor variations; the suitable voltage value to be supplied can be determined based on measurements on the effected transistors 5*c*. Thus, this correcting back gate bias signal VB3 can be provided by the back gate line 22 to the transistors 5*c*, without affecting the back gate bias levels devised for the other transistors 5*a* and 5*b* within the layer 3.

As evident from the exemplary applications discussed above, selective back biasing operates on a "per-block" basis. It can be desirable that the circuit regions independently controlled by the back gate lines be limited to a small size of a particular circuit block, such as a memory, a processor, an analog sub-circuit, or a circuit region particularly affected by process variations. As such, there can be applications where a fine granularity of separate back gate lines may be required for corresponding small sized circuit areas.

In this case, DBI bonding between the layers of the stacked structure 1 becomes particularly advantageous because it provides a high density of interconnects between the stacked layers, required by such a granular arrangement of back gate lines. This is even more relevant when several other lines are operatively associated with the different circuit blocks controlled by the back gate lines, such as in the embodiment illustrated in FIG. 4.

The slacked structures 1 illustrated in FIGS. 1-4 can be realized by wafer-to-wafer, die-to-wafer, or die-to-die bonding. In particular, a die of the upper layer 3 can comprise different functional circuit blocks or regions selectively back biased as above disclosed.

Also note that while the stacks illustrated in FIGS. 1-4 only show one layer stacked on top of one another, in other applications more than one die may be stacked on a given lower layer.

Note that FIGS. 1-4 are not shown to scale and especially the size of the bond pads 10, 11 may be significantly larger than the size of the transistors 5.

It to be understood that the number of layers of a stacked structure, the number of back gate lines and the number of corresponding underlying transistors within a given layer can be different according to different applications.

The invention claimed is:

1. A microelectronic circuit structure comprising:

a bottom layer and at least one upper layer bonded to the bottom layer by hybrid direct bonding without an adhesive, the at least one upper layer comprising an oxide layer having a back surface and a front surface closer to the bottom layer than the back surface, the back surface being an oxide surface exposed by removing a bulk silicon substrate from a silicon-on-insulator (SOI) substrate;

a plurality of fully depleted silicon-on-insulator (FD-SOI) transistors built on the front surface of the oxide layer; and a plurality of back gate lines on the back surface of the oxide layer, wherein each back gate line is electrically connected to a metal of an interconnection separated from the back gate lines by a passivation layer; and a power supply circuitry connected to different ones of the plurality of back gate lines to selectively provide different back gate biases to different portions of the oxide layer over different groups of the plurality of FD-SOI transistors corresponding to different functional circuit blocks, wherein one of the back gate lines providing one of the back gate biases to one of the groups of the FD-SOI transistors is further connected to the bottom layer by a through-substate via formed through the at least one upper layer.

2. The microelectronic circuit structure of claim 1, wherein the metal is disposed on and above an upper surface of the passivation layer.

3. The microelectronic circuit structure of claim 2, wherein the each back gate line and the metal are directly connected to each other by opposing ends of a single conductive pathway extending in a stacking direction.

4. The microelectronic circuit structure of claim 1, wherein at least one of the back gate lines extend on back surface of the oxide layer to provide one of the back gate biases to the multiple ones of the FD-SOI transistors.

5. The microelectronic circuit structure of claim 1, further comprising:

a group of FD-SOI transistors with no back gate line extending thereon on the back surface of the oxide layer.

6. The microelectronic circuit structure of claim 1, further comprising:

a plurality of contacts, wherein at least one contact directly connects a metal feature of the interconnection to a metal feature of the bottom layer.

7. The microelectronic circuit structure of claim 1, further comprising:

a plurality of contacts, wherein at least one contact directly connects a metal feature of the interconnection to a metal feature of the at least one upper layer on a front surface side of the oxide layer.

8. The microelectronic circuit structure of claim 1, further comprising:

a plurality of contacts, wherein at least one contact directly connects a metal feature of the interconnection to a back gate line of the plurality of back gate lines.

9. The microelectronic circuit structure of claim 1, wherein at least one back gate line of the plurality of back gate lines is electrically connected to a direct bonding pad.

10. The microelectronic circuit structure of claim 1, wherein:

a first group of the plurality of FD-SOI transistors form part of a processor; and a second group of the plurality of FD-SOI transistors form part of a memory.

11. The microelectronic circuit structure of claim 10, wherein a first back gate bias of a first value is configured to be applied to a first back gate line during an idle state of the processor and a second back gate bias of a second value different from the first value is configured to be applied to the first back gate line during a computing state of the processor.

12. The microelectronic circuit structure of claim 11, wherein a third back gate bias of a third value different from the first value and the second value is provided to the first back gate line.

13. The microelectronic circuit structure of claim 11, wherein the second value is adjustable based on a fluctuating computational workload.

14. The microelectronic circuit structure of claim 1, wherein the power supply circuitry is connected to:

a first back gate line of the plurality of back gate lines configured to provide a first back gate bias to a first group of transistors of the plurality of FD-SOI transistors belonging to processor transistors, a second back gate line of the plurality of back gate lines configured to provide a second back gate bias to a second group of transistors of the plurality of FD-SOI transistors belonging to a first memory, and a third back gate line of the plurality of back gate lines configured to provide a third back gate bias to a third group of transistors of the plurality of FD-SOI transistors belonging to a second memory operating at a lower speed than the first memory.

15. The microelectronic circuit structure of claim 14, wherein the second back gate bias of a first value is configured to be provided to the first back gate line, and the third back gate bias signal of a second value different from the first value is configured to be provided to the third back gate line.

16. The microelectronic circuit structure of claim 14, further comprising:

a memory control circuit connected to the second group of transistors of the plurality of FD-SOI transistors belonging to the first memory through a plurality of first data lines and connected to the third group of transistors of the plurality of FD-SOI transistors belonging to the second memory through a plurality of second data lines operating at a lower speed than the first data lines.

17. The microelectronic circuit structure of claim 14, further comprising:

a clock generating circuit configured to supply a first clock signal to the second group of transistors of the plurality of FD-SOI transistors belonging to the first memory and supply a second clock signal, at lower frequency than the first clock signal, to the second group of transistors of the plurality of FD-SOI transistors belonging to the second memory.

18. The microelectronic circuit structure of claim 1, wherein the at least one upper layer comprises a first upper layer and a second upper layer and the second upper layer is bonded to the first upper layer through a direct bonding interconnect (DBI).

19. The microelectronic circuit structure of claim 1, wherein the bottom layer comprises a silicon-on-insulator (SOI) integrated circuit.

20. The microelectronic circuit structure of claim 1, wherein the bottom layer comprises a bulk substrate integrated circuit.

21. The microelectronic circuit structure of claim 1, wherein at least one of the back gate lines extend laterally on the back surface of the oxide layer to overlap two or more of the FD-SOI transistors and serve as a common back gate electrode for the two or more of the FD-SOI transistors.

* * * * *